(12) United States Patent
Chang et al.

(10) Patent No.: US 10,069,566 B2
(45) Date of Patent: Sep. 4, 2018

(54) STRUCTURE OF PHOTOELECTRIC CONVERSION ASSEMBLY HAVING A CIRCUIT BOARD EMBEDDED WITHIN THE CONCAVE PORTION OF AN OPTICAL BENCH

(71) Applicant: AQUAOPTICS CORP., Tainan (TW)

(72) Inventors: Chia-Chi Chang, Taipei (TW); Tung-An Lee, Zhubei (TW); Shih-Jye Yo, Zhubei (TW)

(73) Assignee: AQUAOPTICS CORP., Zhubei (TW)

( * ) Notice: Subject to any disclaimer, the term of this patent is extended or adjusted under 35 U.S.C. 154(b) by 285 days.

(21) Appl. No.: 15/061,101

(22) Filed: Mar. 4, 2016

(65) Prior Publication Data

US 2017/0126318 A1    May 4, 2017

(30) Foreign Application Priority Data

Nov. 2, 2015 (TW) .............................. 104136084 A

(51) Int. Cl.
*G02B 6/42* (2006.01)
*H04B 10/25* (2013.01)

(52) U.S. Cl.
CPC .................. *H04B 10/2504* (2013.01)

(58) Field of Classification Search
CPC ...... G02B 6/4245; G02B 6/4284; G02B 6/43; G02B 6/428; G02B 6/4246; G02B 6/426; G02B 6/4292; G02B 6/3885; G02B 6/4278; H04B 10/2054
USPC ............................................ 250/551, 227.11
See application file for complete search history.

(56) References Cited

U.S. PATENT DOCUMENTS 9,134,489 B2 *  9/2015  Zbinden ............... G02B 6/4214
9,207,415 B2 * 12/2015  Kuang ................. G02B 6/4281

* cited by examiner

*Primary Examiner* — Que T Le
(74) *Attorney, Agent, or Firm* — Chih Feng Yeh; Huntington IP Consulting Co., Ltd.

(57) ABSTRACT

A photoelectric conversion assembly is proposed. The photoelectric conversion module comprises three parts, photoelectric conversion module, a printed circuit board (PCB) and a hybrid cable. The photoelectric conversion module comprises an interposer, at least one optical element configured on the interposer, and an optical bench for the printed circuit board and the interposer configured thereon. Electrical wires are used for coupling to the printed circuit board. An optical ferrule is used for engaging with the photoelectric conversion module and an optical fiber component. A plug is used for electrically connecting the printed circuit board. A first lens array is configured under the interposer. A mirror is configured under the first lens array. A second lens array is configured left side of the mirror.

20 Claims, 9 Drawing Sheets

STRUCTURE OF PHOTOELECTRIC CONVERSION ASSEMBLY HAVING A CIRCUIT BOARD EMBEDDED WITHIN THE CONCAVE PORTION OF AN OPTICAL BENCH

TECHNICAL FIELD

The present invention relates to a photoelectric device, and more particularly, to a photoelectric conversion assembly to provide signal transmission and conversion between the optical devices and electrical devices.

BACKGROUND

Light beams or optical signals are frequently used to transmit digital data between electronic devices, both over long distances and between adjacent circuit boards. A light beam may be modulated as needed to carry data. An optical signal may also be used for other purposes including position or motion sensing, measurement, etc.

Typically, a typical multi-fiber optic connector includes a ferrule assembly supported at a distal end of a connector housing. The ferrule assembly can include a multi-fiber ferrule mounted in a hub. A spring is used to bias the ferrule assembly in a distal direction relative to the connector housing. The multi-fiber ferrule functions to support the end portions of multiple optical fibers. The multi-fiber ferrule has a distal end face at which polished ends of the optical fibers are located. When two multi-fiber optic connectors are interconnected, the distal end faces of the multi-fiber ferrules oppose and are biased toward one another by their respective springs. With the multi-fiber optic connectors connected, their respective optical fibers are coaxially aligned such that the end faces of the optical fibers directly oppose one another. In this way, optical signals can be transmitted from one optical fiber to another optical fiber through the aligned end faces of the optical fibers.

Systems for interconnecting optical fibers typically utilize mating ferrule assemblies to facilitate handling and accurate positioning of the fibers. The optical fibers are secured within a ferrule body, with an end surface of each fiber being positioned generally flush with or slightly protruding from an end face of the ferrule body. The end surfaces or faces of the fibers are then polished to a desired finish. When complementary ferrules assemblies are mated, each optical fiber of a ferrule assembly is coaxially positioned with a mating optical fiber of the other ferrule assembly. In some applications, the end faces of the mating optical fibers physically contact one another in order to effect signal transmission between the mating optical fiber pair. In such applications, various factors may reduce the efficiency of the light transmission between the optical fiber pair.

Consequently, optical technology plays a significant role in modern electronic devices, and many electronic devices employ optical components. Examples of such optical components include optical or light sources such as light emitting diodes and lasers, waveguides, fiber optics, lenses and other optics, photo-detectors and other optical sensors, optically-sensitive semiconductors, and others.

The use of the optical fibers requires photoelectric conversion modules to convert electrical signals to optical signals, or optical signals to electrical signals. Also, the photoelectric conversion modules are attached to be fixed to ends of the optical fibers, or to be attachable to or detachable from ends of the optical fibers.

SUMMARY OF THE INVENTION

In this invention, a photoelectric conversion assembly is proposed. The photoelectric conversion assembly comprises a photoelectric conversion module, a printed circuit board for coupling to the photoelectric conversion module, electrical wires for coupling to the printed circuit board, an optical fiber component for transmitting light, an optical ferrule for engaging with the photoelectric conversion module and the optical fiber component, and a plug for electrically connecting the printed circuit board.

The photoelectric conversion module comprises an interposer, at least one optical element configured on the interposer, an optical bench having a first placement area for the printed circuit board configured thereon and a second placement area for the interposer configured thereon, a first lens array configured under the interposer to align the at least one optical element, a mirror configured under the first lens array, and a second lens array configured left side of the mirror.

According to one aspect, the photoelectric conversion module comprises an interposer with an optical waveguide portion and V-shape trench having a first optical micro-reflection surface and a second optical micro-reflection surface opposite to the first optical micro-reflection surface, at least one optical element configured on the interposer, an optical bench having a first placement area for the printed circuit board configured thereon and a second placement area for the interposer configured thereon, and a lens array configured to align the optical waveguide portion.

According to one aspect, the optical bench has a first concave portion for the first lens array formed thereon and a second concave portion for the second lens array formed thereon. The arrangement orientation of the first lens array is the same as the second lens array. The first lens array, the second lens array and the mirror are embedded into the optical bench. A conductive trace is formed on the interposer to couple the at least one optical element.

According to another aspect, at least one IC is optionally configured on the interposer to couple the conductive trace formed on the interposer.

According to yet another aspect, the printed circuit board is attached on the first placement area of the optical bench by using an adhesive material. The interposer is attached (mounted) on the second placement area of the optical bench by using an adhesive material.

Size of the interposer is less than or equal to that of the second placement area of the optical bench.

The photoelectric conversion assembly further comprises a guide pin for engaging the optical ferrule with the optical bench and the optical fiber component. The printed circuit board has conductive terminal to electrically connect to the electrical wires. A conductive trace is formed on the printed circuit board. The first placement area locates two sides of the optical bench. The interposer has a through hole passing through a top surface of the interposer to a bottom surface of the interposer.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Figure 1:
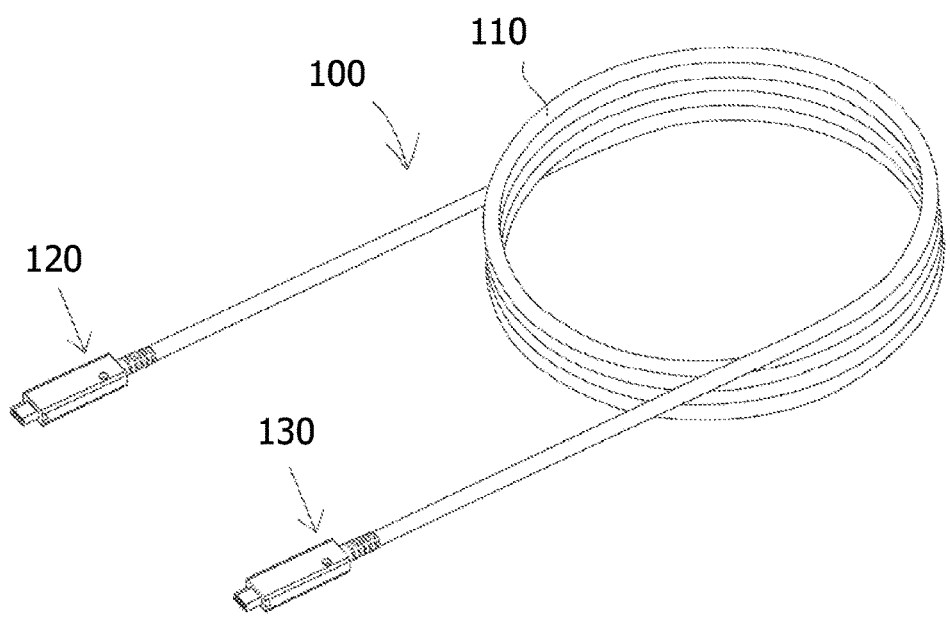
FIG. 1 illustrates a schematic structural perspective view showing an active optical cable provided with photoelectric conversion module according to an embodiment of the invention.

FIG. 1 illustrates a schematic perspective view showing an outer appearance of an active optical cable (AOC) 100. The active optical cable 100 is composed of a photoelectric composite cable 110, and a first photoelectric conversion assembly 120 and a second photoelectric conversion assembly 130 which are attached to both ends of the photoelectric composite cable 110. The active optical cable 100 may be used for unidirectional transmission or bidirectional transmission. The active optical cable 100 may be applied to be as a high speed transmission wire, such as Universal Serial Bus (USB), High-Definition Multimedia Interface (HDMI), Lighting or Thunderbolt interface, for cable line consumer products, or applied to be as a transmission wire, such as storage BUS including Fiber Channel (FC), Serial Attached SCSI (SAS), Peripheral Component Interconnect express (PCIe) or Serial Advanced Technology Attachment (SATA), for photoelectric products or equipment. In an example, active optical cable 100 may be used for connection between digital audio-video (AV) apparatus or equipment. In one embodiment, the first photoelectric conversion assembly 120 is an optical transmitter and the second photoelectric conversion assembly 130 is an optical receiver, for unidirectional transmission. In another embodiment, the first photoelectric conversion assembly 120 is a first optical transceiver and the second photoelectric conversion assembly 130 is a second optical transceiver, for bidirectional transmission. For example, the photoelectric composite cable 110 may be using an optical fiber cable or a hybrid cable depending on various applications. The hybrid cable is composed of optical fiber and electrical wire.

Figure 2:
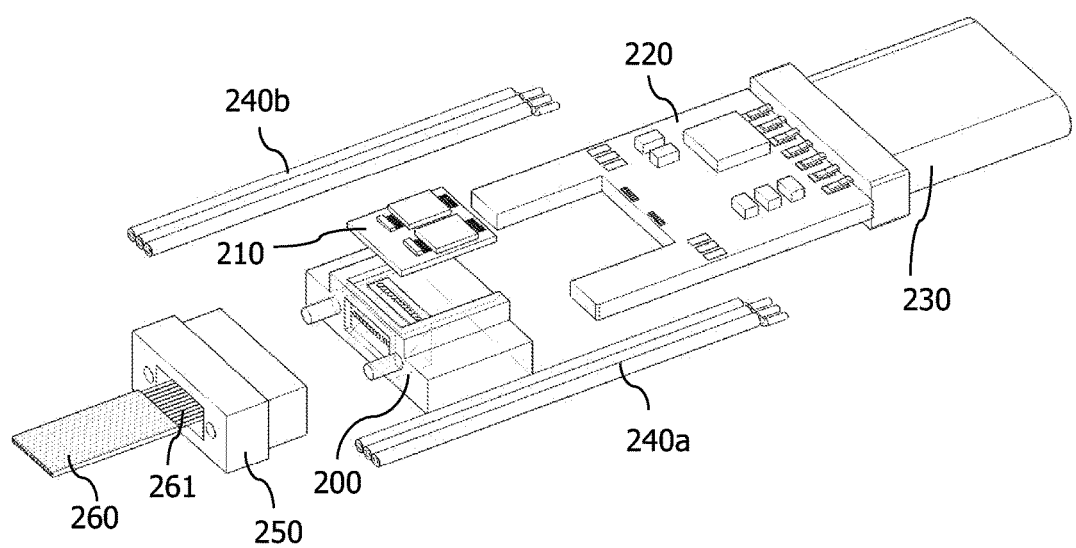
FIG. 2 illustrates a schematic perspective view showing a photoelectric conversion assembly according to an embodiment of the invention.

FIG. 2 illustrates a schematic perspective view showing photoelectric conversion assembly according to an embodiment of the invention. The photoelectric conversion assembly comprises a photoelectric conversion component/module, a printed circuit board (PCB) 220, and a photoelectric composite cable, wherein the photoelectric conversion component/module may be used for unidirectional transmission or bidirectional transmission. The photoelectric conversion component/module may be applied to a high speed transmission interface, such as USB, HDMI, Lighting or Thunderbolt interface, for cable line consumer products, or applied to a transmission interface, such as storage BUS including Fiber Channel (FC), SAS, PCIe or SATA, for photoelectric products or equipment. In one embodiment, the photoelectric conversion module may be as an optical transmitter or an optical receiver, for unidirectional transmission. In another embodiment, the photoelectric conversion module may be as an optical transceiver for bidirectional transmission. In one embodiment, the photoelectric conversion component/module comprises an optical bench 200 and an interposer 210. In one embodiment, photoelectric composite cable is a hybrid cable including an optical fiber component 260 and electrical wires 240a and 240b.The photoelectric conversion assembly further comprises an optical ferrule 250 for engaging/connecting with the optical bench 200 and the optical fiber component 260, and a plug 230 for electrically connecting the printed circuit board (PCB) 220.

In one embodiment, optical fiber component 260 is an optical ribbon fiber or bundle fiber. The optical ribbon fiber 260 has optical fibers 261 inserted into receiving holes, bores or grooves of the optical ferrule 250 for electrically coupling to optical elements configured on the interposer 210. The optical fibers 261 are inserted into the optical ferrule 250 for coupling/connecting (engaging) to the photoelectric conversion module. The receiving holes or bores are generally cylindrical. For example, the optical fibers 261 are multimode fibers or single mode fiber. The optical fibers 261 aligned in series are multimode fibers that are included in the optical ribbon fiber 260. Each of the optical fibers 261 has a core formed at a center thereof, a cladding surrounding the core, and a coating layer coated on an outer surface of the cladding in order to protect the core and the cladding, wherein reflective index (n) of the core is 1.35~1.70 and reflective index of the cladding is 1.35~1.70.The optical fibers 261 are for example 50/125, 62.5/125, or 80/125 graded index (GI) multimode fibers.

Figure 3:
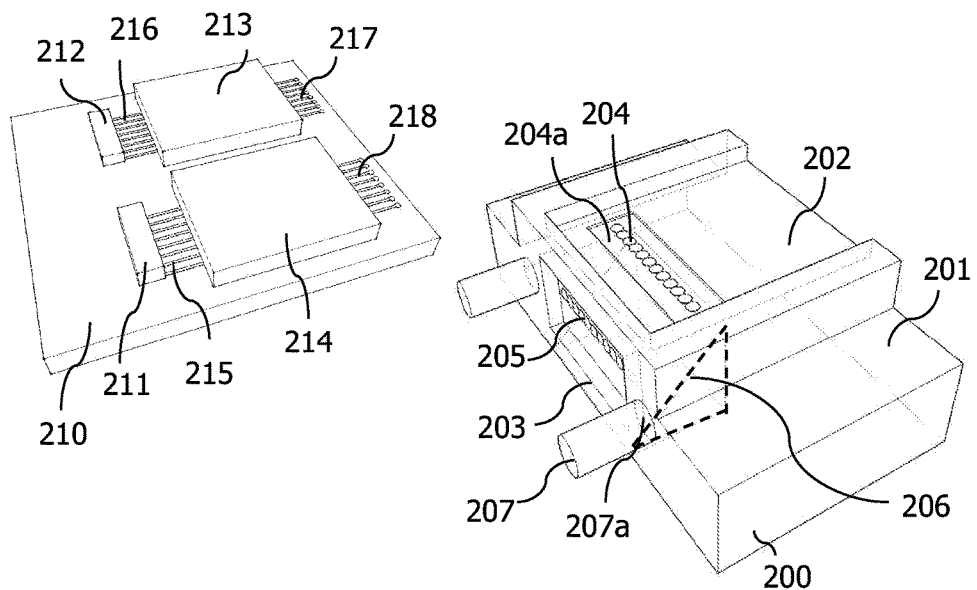
FIG. 3 illustrates a perspective view showing an interposer and an optical bench of the photoelectric conversion module according to an embodiment of the invention.

FIG. 3 illustrates a perspective view showing an interposer and an optical bench of the photoelectric conversion module according to an embodiment of the invention. In one embodiment, optical elements are configured on the interposer 210. For example, a light source chip 212 and a light receiving element 211 are configured on the interposer 210. In one embodiment, a light source chip, a photo diode, a photo detector chip or a photosensitive chip is configured on the interposer 210. In one embodiment, ICs 213, 214 are configured on the interposer 210, for example a driver integrated circuit (IC), a control IC or a trans-impedance amplifier (TIA) chip, or others active components, configured on the interposer 210. Moreover, passive electronic components may be configured on the interposer 210. In another embodiment, ICs, passive electronic components may be configured on the printed circuit board 220. Conductive trace 218, 217, 216 and 215 are configured on the interposer 210. Conductive trace 218, 217, 216 and 215 may be formed by an identical manufacturing process. In one example, the light source chip 212, the light receiving element 211 and ICs 213, 214 are packaged on the interposer 210 by a flip-chip mounting process. The conductive trace 218, 217 on the interposer 210 may be electrically connected to outer circuits (conductive trace 225 on the PCB 220, shown in FIG. 5), for example by wire bonding or directly electrically connecting. The conductive trace 216 on the interposer 210 is electrically connected to the light source chip 212 and ICs 213, and the conductive trace 215 on the interposer 210 is electrically connected to the light receiving element 211 and ICs 214. Material of the interposer 210 comprises silicon, silica, ceramic, or dielectric material, or the interposer 210 is flexible print circuit (FPC) as a substrate. In one embodiment, the optical bench 200 is fabricated by using an injection molding process, such as plastic injection molding process, to form a first placement area (platform) 201, a second placement area (platform) 202, and lens array 204, 205. The first placement area (platform) 201 is used for supporting the PCB 220, and the second placement area (platform) 202 is used for supporting the interposer 210. In one embodiment, the first placement area 201 locates two sides of the optical bench 200 with first concave portion, and the second placement area (platform) 202 is formed to be U-shape or mouth font with a second concave portion. In one embodiment, the lens array 204, 205 are used for light focusing or collimating. The lens array 204, 205 may be used to improve efficiency of optical usage and increase allowable value of optical package.

Size of the interposer 210 is less than or equal to that of the second placement area 202 of the optical bench 200.

The photoelectric conversion module has the interposer 210 and the optical bench 200 with doubles sides lens array 204, 205. In one embodiment, arrangement orientation of the lens array 204 is the same as the lens array 205. The optical bench 200 has a concave portion 202 for the interposer 210 configured/fixed thereon, and the interposer 210 is disposed within the concave portion 202. The optical bench 200 has a third concave portion 203 which locates front side of the optical bench 200 for the lens array 205 formed thereon. In one embodiment, the lens array 204, 205 and the mirror 206 are embedded (integrated) into the optical bench 200. A mirror or reflector 206 is integrated into the optical bench 200.

The mirror or reflector 206 is passively for optical signal excited by the light source chip 212 to be non-coplanar turning (optical reflection), and the optical signal is guided to the external optical transmission medium, such as optical fibers 261. Conversely, optical signals through an external optical transmission medium (optical fibers 261) are non-coplanar turning by the mirror 206 to guide the optical signals to be received by the light receiving element 211. The mirror 206 can be fabricated to directly integrate into the optical bench 200 or the interposer 210.

Figure 4:
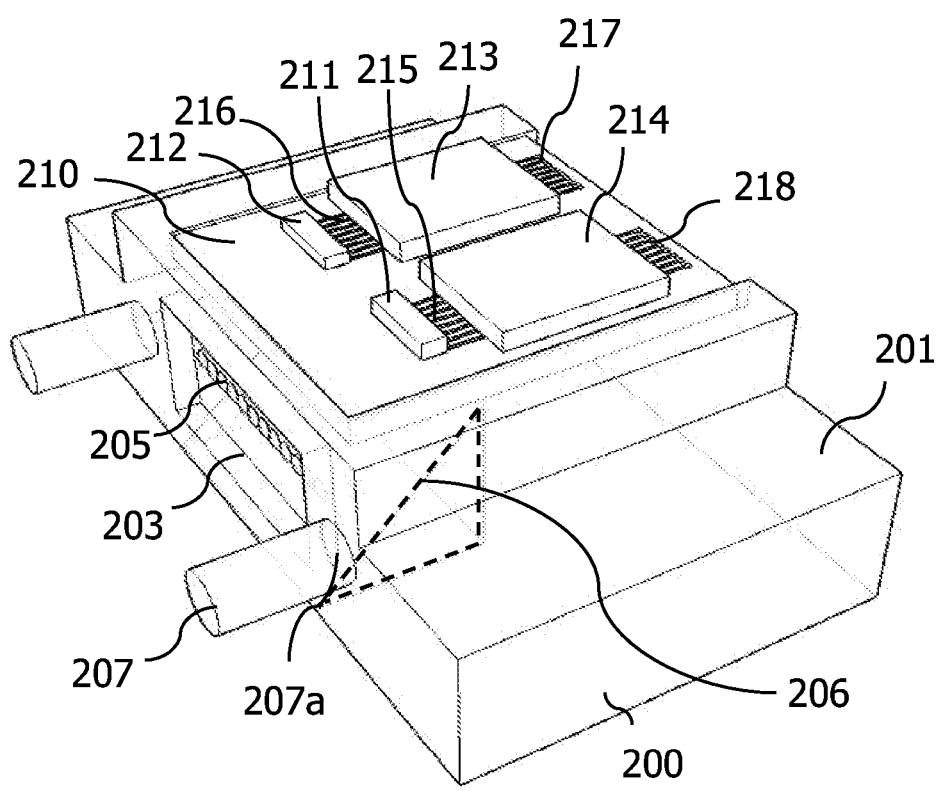
FIG. 4 is a perspective view showing the photoelectric conversion module according to an embodiment of the invention.
Figure 5:
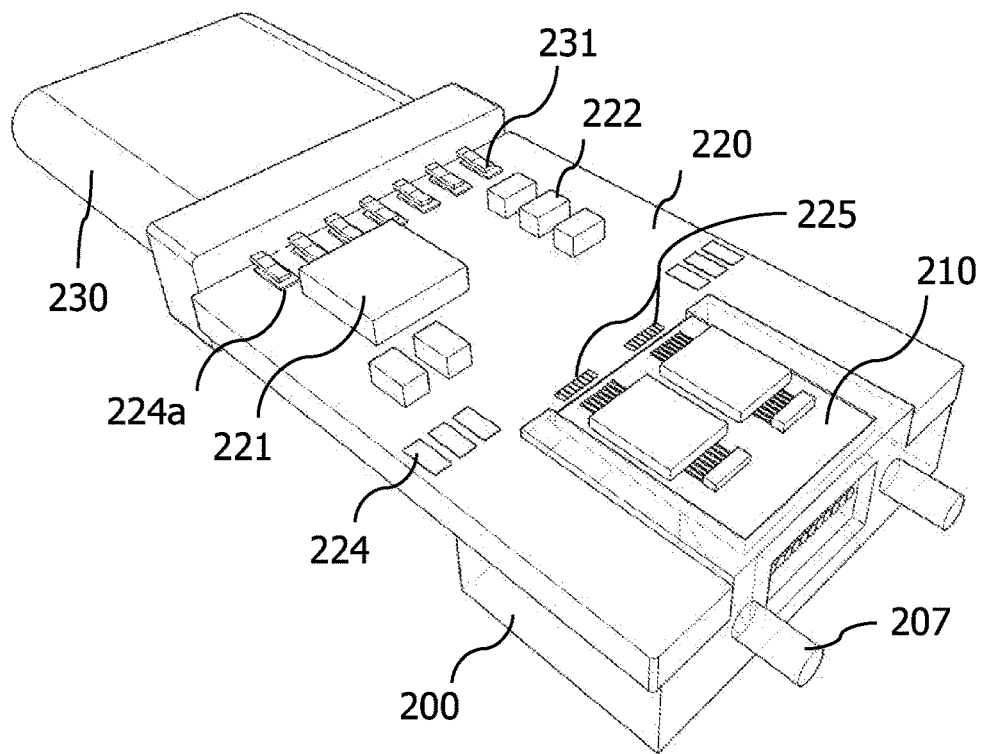
FIG. 5 illustrates a perspective view showing a PCB integrated on an optical bench of the photoelectric conversion module according to another embodiment of the invention.

The interposer 210 may be attached on the second concave portion 202 of the optical bench 200 by using an adhesive material, such as epoxy, shown in FIG. 4. The PCB 220 may be further attached on the first concave portion 201 of the optical bench 200 by using an adhesive material, such as epoxy, shown in FIG. 5. As shown in FIG. 5, the PCB 220 has electrical wire soldering pads 224, pads 224a and wire bond pads 225 formed thereon. The pads 224a are used to electrically connect to the plug 230. The conductive terminal 231 of the plug 230 may be soldering on the pads 224a of the PCB 220, shown in FIG. 6. The electrical wire soldering pads 224 are used for electrically connecting the electrical wires 240a and 240b.The conductive terminal of the electrical wires 240a and 240b may be soldering on the electrical wire soldering pads 224 of the PCB 220, shown in FIG. 6. The wire bond pads 225 are used for electrically connecting the conductive trace (metal trace) 217 and 218 on the interposer 210, for example electrically connecting by a wire bonding process. In one embodiment, the PCB 220 has at least one IC 221 and at least one passive component 222 configured thereon.

Figure 6:
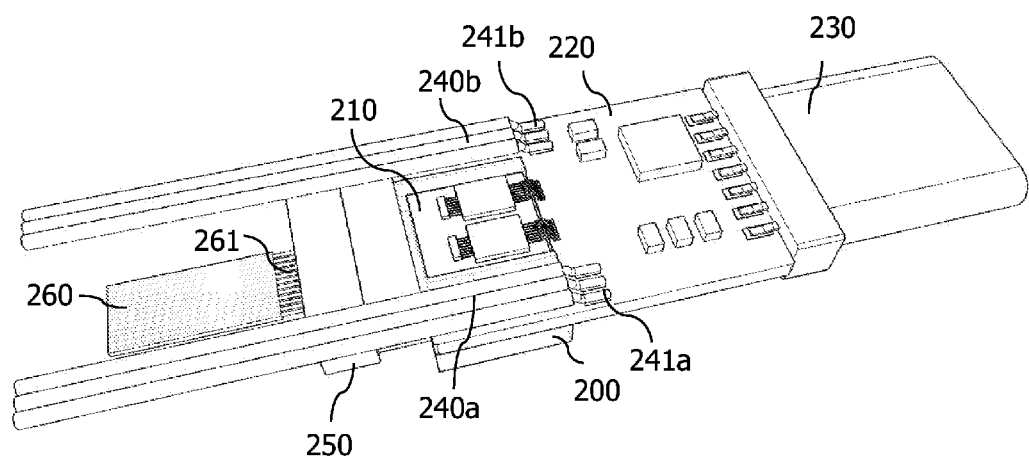
FIG. 6 illustrates the AOC photoelectric conversion assembly according to one embodiment of the invention.

In one embodiment, the optical ferrule 250 includes a fiber connecting portion and an optical bench connecting portion for connecting the optical fiber component 260 and the optical bench 200 respectively, shown in FIG. 6. The optical ferrule 250 may be as a joint of external optical transmission medium (optical fiber). The receiving holes, bores or grooves extend through from the front surface of the fiber connecting portion to the rear surface of the optical bench connecting portion. In one embodiment, the fiber connecting portion and the optical bench connecting portion may be integrally fabricated.

The optical bench connecting portion includes a mating recess (guide holes) formed therein for receiving the guide pins 207. The optical bench 200 also includes the guide pins 207. As depicted in FIG. 3, a mating portion (guide pins) 207 may be engaged into the mating recess (guide holes) of the optical bench connecting portion. In the depicted FIG. 3, the guide pins 207 is located adjacent sides of the lens array 205 of the optical bench 200. In one embodiment, the guide holes extend through the optical bench connecting portion, or through the front surface of the fiber connecting portion to the rear surface of the optical bench connecting portion. The guide pins 207 of the optical bench 200 aligns to the mating recess (guide holes) of the optical bench connecting portion to facilitate aligning and connecting the optical bench connecting portion of the optical ferrule 250 and the optical bench 200 of the photoelectric conversion module when the guide pins 207 matches the mating recess (guide holes) of the optical bench connecting portion. In one embodiment, the guide pin 207 and the optical bench 200 are integrally manufactured. In another embodiment, the guide pin 207 and the optical ferrule 250 are integrally manufactured, and the optical bench 200 has guide holes for engaging with the optical ferrule 250. In one embodiment, the optical bench 200 is fabricated by using an injection molding process, such as plastic injection molding process, to form a first placement area (platform) 201, a second placement area (platform) 202, lens array 204, 205 and the guide pin 207.

In one embodiment, length of the multi-channel fiber connecting portion is less 10 mm (minimeters), thickness of the multi-channel fiber connecting portion is less 3 mm, and width of the multi-channel fiber connecting portion is less 5 mm. Thus, the multi-channel fiber connecting portion of the invention has smaller size than prior arts.

Figure 7:
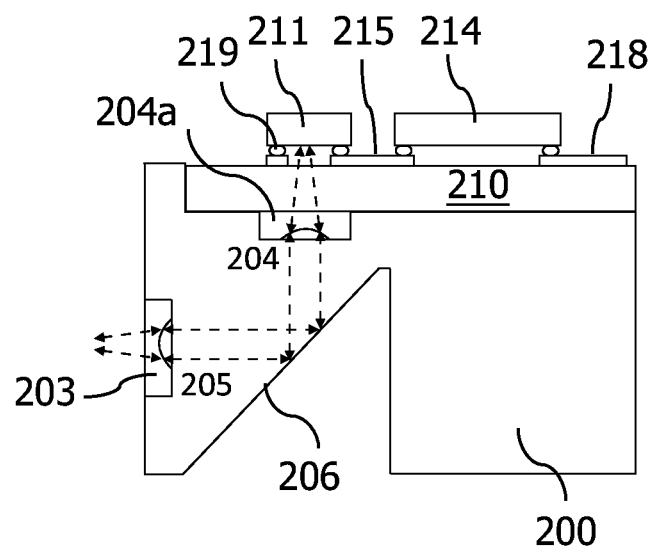
FIG. 7 illustrates a cross-sectional view showing the photoelectric conversion module according to one embodiment of the invention.

As shown in FIG. 7, the lens array 204 is formed on the bottom surface of a fourth concave portion 204a under the bottom surface of the concave portion 202 of the optical bench 200, aligning optical elements (light source chip 212 and light receiving element 211) on the interposer 210 when the interposer 210 is attached on the second concave portion 202 of the optical bench 200. The lens array 204 locates under the interposer 210. The lens array 205 is formed on (under) the bottom surface of the third concave portion 203 of the optical bench 200. The mirror 206 locates under the lens array 204 and locates right side of the lens array 205. The lens array 204 may be used to make divergent light emitted by the light source chip 212 to form an approximately collimated light, and the emitted light is focusing by the lens array 205 after reflecting by the mirror 206. The light source chip 212 emits light forward to the interposer 210 and passing through the interposer 210 and the lens array 204, and reflecting by the mirror 206 to the lens array 205 for focusing the emitted light and propagating to the external transmission medium (optical fibers 261), shown in FIG. 7. On the other hand, light created by the external device feeds into the optical fibers 261, passing through the lens array 205 to form an approximately collimated light and reflecting by the mirror 206 to pass through the lens array 204 for focusing light and passing through the interposer 210, and thereby receiving the inputted light by the light receiving element 211, shown in FIG. 7.

The rear ends of the plural optical fibers 261 are fixed to an end of the optical bench connecting portion of the optical ferrule 250. The photoelectric conversion module has a function of converting an optical signal (via the plural optical fibers 261) from external electrical apparatus or equipment into an electrical signal, or transmitting an optical signal to the external electrical apparatus or equipment via the plural optical fibers 261.

In one embodiment, ICs are, for example a driver integrated circuit (IC), a control IC or a trans-impedance amplifier (TIA) chip, or others active components, configured on the interposer. The driver IC may be used to drive the light source chip (such as optoelectronic device) for emitting light.

In another embodiment, the photoelectric conversion module has the interposer 210a and the optical bench 200a. The interposer 210a has an optical waveguide portion 210b and a mirror 210d, and the optical bench 200a has a single lens array 205, shown in FIG. 8. The optical bench 200a has a concave portion 200b for the interposer 210a and the PCB configured/fixed thereon, and the concave portion 200b locates upper side of the interposer 210a. The optical bench 200a has another concave portion 203 which locates front side of the optical bench 200a. The optical waveguide portion and the mirror 210d are integrated into the interposer 210a. The optical waveguide portion is made of core 210b and clad 210c, wherein reflective index of the core 210b is larger than that of the clad 210c. The core 210b is made of a flexible material, such as polymer. The clad 210c is covering over the core 210b. The optical waveguide portion is used as an optical waveguide. The interposer 210a has a concave structure 210e, such as V-shape trench, with an optical micro-reflection surface (mirror) 210d at one side of (within) V-shape trench 210e and rear side of the optical waveguide portion, shown in FIG. 8. The mirror 210d locates under the light source chip 211 and photo diode chip (PD chip) 212 for reflecting optical signals from the light source chip 211 or the optical fibers 261. The mirror 210d has a specified angle (such as 45 degree angle or other degree angle). V-shape trench 210e of the interposer 210a has a specified depth (vertical thickness). The first end of the V-shape trench 210e of the interposer 210a forms a reflection surface. The V-shape trench 210e has a first slant plane and a second slant plane, wherein the first slant plane is opposite to the second slant plane. Vertical thickness of the V-shape trench 210e is larger than that of the core 210b of the optical waveguide portion, and the V-shape trench 210e is passing through the core 210b of the optical waveguide portion. V-shape trench 210e may be formed by an imprinting process, a wedge cutting process or a laser cutting process. In another example, V-shape trench 210e may be formed by a photolithography process and an etching process. Light source chip 211 and photo diode chip (PD chip) 212 are packaged on the interposer 210a. The ICs 213, 214 may be electrically connected to the external devices via the metal trace 161, 160 by wire bond or flip board mounting.

In this embodiment, the interposer 210a has waveguide function used for guiding light. The interposer 210a comprises an optical waveguide portion, such as polymer, embedded into the interposer 210a. In one embodiment, the interposer 210a is a flexible substrate.

Figure 8:
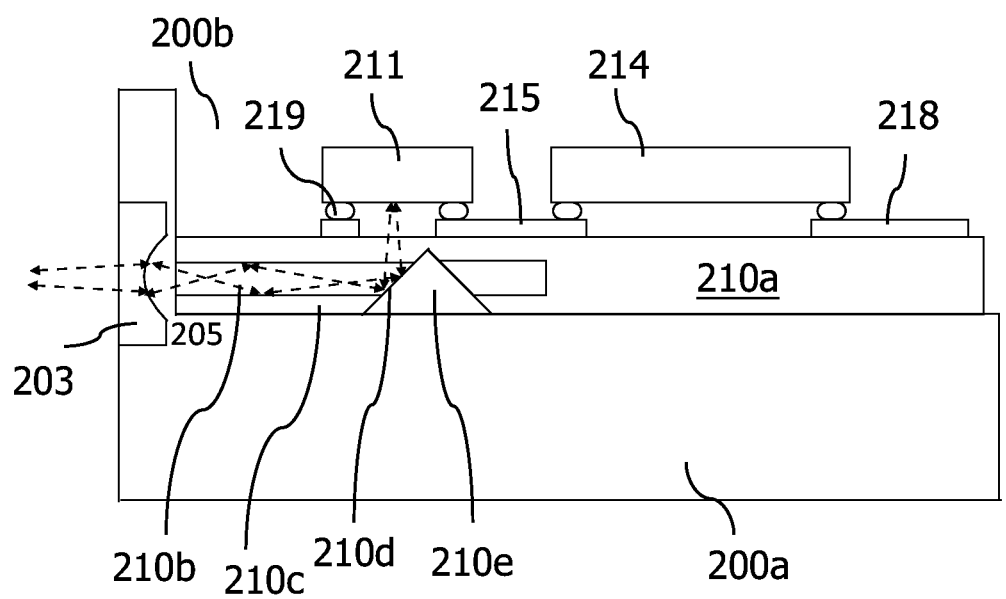
FIG. 8 illustrates a cross-sectional view showing the photoelectric conversion module according to another embodiment of the invention.

The core 210b of the optical waveguide portion aligns to the lens array 205 for optical communication, shown in FIG. 8. Such structure may receive and transmit optical signal through the optical waveguide portion. Light created by the light source chip 211 may be reflected via the optical micro-reflection surface 210d at one side of the optical waveguide portion. The core 210b of the optical waveguide portion is allowable for optical path penetrating therein, for facilitating light emitted from the light source chip 211 or coming from external devices passing through therein. The light source chip 211 is capable of emitting visible and invisible light. The light source chip 211 is for example a laser, infrared light or a light emitting diode (LED). Infrared light is in infrared band, which can be emitted by laser or LED.

For example, the light source chip 211 and the photo detector 212 are arranged in the vicinity of the optical micro-reflection surface 210d. Therefore, optical signal emitted by the light source chip 211 is reflected by the optical micro-reflection surface 210d of the V-shape trench 210e and then passing through the core 210b of the flexible waveguide portion.

Material and thickness of the flexible waveguide portion may be selected, based-on requirements for practical applications. For example, material of the flexible waveguide portion includes polymer material, dielectric material, such as polyimide.

The interposer 210a may be attached on the concave portion 200b of the optical bench 200a by using an adhesive material, such as epoxy, shown in FIG. 7 and FIG. 8. ICs 213, 214 are electrically connected to the external apparatus or equipment for signal connection via the conductive trace 217, 218 of the interposer 210a. V-shape trench 210e faces the top surface of the optical bench 200a within the concave portion 200b when the interposer 210a is attached on the optical bench 200a.

The optical bench combines with the interposer having flexible waveguide (optical waveguide portion) for optical communication. Such structure may receive and transmit optical signal through the flexible waveguide. Light created by the light source may be reflected via the optical micro-reflection surface at one side of the flexible substrate.

As noted above, the flexible waveguide (optical waveguide portion) of the flexible substrate includes an under cladding layer, a core and an over cladding layer. Materials of the under cladding layer, the core and the over cladding layer are not specifically limited, and it is possible to used, e.g., an acrylic resin, an epoxy resin and a polyimide resin, etc.

The optical micro-reflection surface is arranged on an optical path extending between the light source (photoelectric conversion array element) 211 and the core to bend the optical path 90 degree.

Figure 9A:
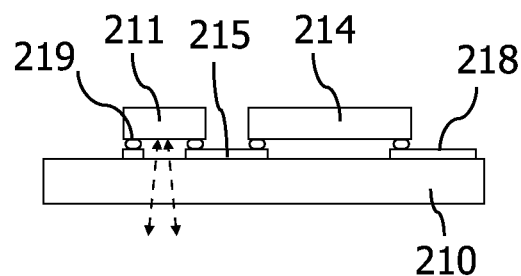
FIGS. 9a and 9b illustrate a cross-sectional view showing an interposer according to one embodiment of the invention.
Figure 9B:
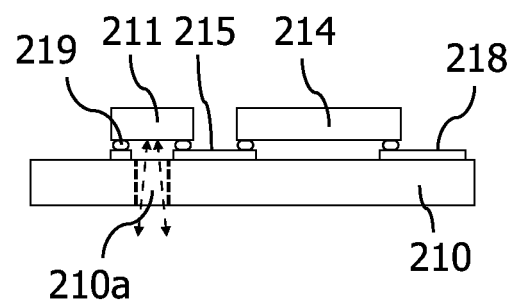

The interposer 210 is allowable for optical path penetrating therein, for facilitating light emitted from the light source chip 212 or coming from external devices passing through therein, shown in FIG. 9a. In another embodiment, interposer 210 has a through hole 210a passing through a top surface of the interposer 210 to a bottom surface of the interposer 210 allowable for optical path penetrating therein, for facilitating light emitted from the light source chip 212 or coming from external devices passing through therein, shown in FIG. 9b. Conductive bump 219 (for example solder bump, metal bump or gold bump) may be formed on the conductive trace 215, 216, 217 and 218 for coupling to the light source chip 212, the light receiving element 211 and the ICs 213, 214. The light source chip 212 is capable of emitting visible and invisible light. The light source chip 212 is for example a laser, infrared light or a light emitting diode (LED) Infrared light is in infrared band, which can be emitted by laser or LED.

The conductive trace on the interposer may be electrically connected to ICs or the circuit board by wire bond or flip board for signal connection.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A structure of photoelectric conversion assembly, comprising:
    a photoelectric conversion module;
    a printed circuit board for coupling to said photoelectric conversion module;
    electrical wires for coupling to said printed circuit board;
    an optical fiber component for transmitting light;
    an optical ferrule for engaging with said photoelectric conversion module and said optical fiber component; and
    a plug for electrically connecting said printed circuit board;
    wherein structure of said photoelectric conversion module comprises:
    a circuit board having conductive trace formed thereon;
    at least one optical element flip-chip mounted on said circuit board and coupled to said conductive trace on said circuit board;
    an optical bench having a first concave portion and a second concave portion, wherein front side of said printed circuit board is disposed on said first concave portion at two sides of said optical bench, and said circuit board is embedded within said second concave portion of said optical bench to reduce height of said structure of photoelectric conversion assembly; and
    wire bond pads of said printed circuit board are electrically connected to said conductive trace of said circuit board by wire bonding.

2. The structure of claim 1, wherein said photoelectric conversion module further comprises:
    a first lens array configured under said circuit board to align said at least one optical element;
    a mirror configured under said first lens array; and
    a second lens array configured left side of said mirror.

3. The structure of claim 1, wherein said circuit board has a through hole passing through a top surface of said circuit board to a bottom surface of said circuit board.

4. The structure of claim 2, wherein said circuit board is attached on said second concave portion of said optical bench by using an adhesive material.

5. The structure of claim 2, wherein arrangement orientation of said first lens array is the same as said second lens array.

6. The structure of claim 2, wherein said first lens array, said second lens array and said mirror are embedded into said optical bench.

7. The structure of claim 2, wherein said at least one optical element is a light source chip, a photo diode chip, a photo detector chip or a photosensitive chip.

8. The structure of claim 2, further comprising a conductive trace formed on said circuit board to couple said at least one optical element.

9. The structure of claim 2, further comprising at least one IC formed on said circuit board.

10. The structure of claim 2, wherein a size of said circuit board is less than or equal to that of said second concave portion of said optical bench.

11. The structure of claim 2, further comprising a guide pin for engaging said optical ferrule with said optical bench.

12. The structure of claim 2, wherein said circuit board has a through hole passing through a top surface of said circuit board to a bottom surface of said circuit board.

13. The structure of claim 1, wherein
    said circuit board further includes an optical waveguide portion and V-shape trench;
    and
    wherein said optical bench includes a lens array configured to align said optical waveguide portion.

14. The structure of claim 13, further comprising at least one IC formed on said circuit board.

15. The structure of claim 13, wherein said circuit board is attached on said second concave portion of said optical bench by using an adhesive material.

16. The structure of claim 15, wherein a size of said circuit board is less than or equal to that of said second concave portion of said optical bench.

17. The structure of claim 13, wherein said at least one optical element is a light source chip, a photo diode chip, a photo detector chip or a photosensitive chip.

18. The structure of claim 13, further comprising a conductive trace formed on said circuit board to couple said at least one optical element.

19. The structure of claim 13, further comprising a guide pin for engaging said optical ferrule with said optical bench.

20. The structure of claim 13, wherein a size of said circuit board is less than or equal to that of said second concave portion of said optical bench.

* * * * *